United States Patent
Tang (10) Patent No.: US 10,643,911 B2
(45) Date of Patent: May 5, 2020

(54) SCRIBE LINE STRUCTURE

(71) Applicant: UNITED MICROELECTRONICS CORP., Hsin-Chu (TW)

(72) Inventor: Kuang-Hui Tang, Kaohsiung (TW)

(73) Assignee: UNITED MICROELECTRIC CORP., Hsin-Chu (TW)

( * ) Notice: Subject to any disclaimer, the term of this patent is extended or adjusted under 35 U.S.C. 154(b) by 70 days.

(21) Appl. No.: 14/164,282

(22) Filed: Jan. 27, 2014

(65) Prior Publication Data

US 2015/0214125 A1 Jul. 30, 2015

(51) Int. Cl.
*H01L 21/66* (2006.01)

(52) U.S. Cl.
CPC .............. *H01L 22/34* (2013.01); *H01L 22/32* (2013.01)

(58) Field of Classification Search
CPC .................................. H01L 22/32; H01L 22/34
See application file for complete search history.

(56) References Cited

U.S. PATENT DOCUMENTS

| | | | | |
|---|---|---|---|---|
| 8,039,367 B2 * | 10/2011 | Wu | ........................ | H01L 21/78 257/48 |
| 8,368,180 B2 * | 2/2013 | Yu | ........................ | H01L 21/78 257/620 |
| 2007/0269961 A1 | 11/2007 | Wu | | |
| 2008/0164469 A1 * | 7/2008 | Kim | ........................ | G03F 9/7076 257/48 |
| 2008/0230874 A1 * | 9/2008 | Yamada et al. | ................ | 257/620 |
| 2009/0283869 A1 * | 11/2009 | Wu et al. | ........................ | 257/620 |
| 2010/0252916 A1 * | 10/2010 | Chen | ........................ | H01L 21/78 257/620 |
| 2011/0291285 A1 * | 12/2011 | Ueberreiter | ........... | H01L 23/528 257/773 |
| 2012/0326146 A1 * | 12/2012 | Hui | ........................ | H01L 23/58 257/48 |
| 2013/0009656 A1 * | 1/2013 | Wu | ........................ | H01L 22/34 324/755.01 |
| 2013/0069206 A1 * | 3/2013 | Yoshizawa | ............. | H01L 22/34 257/620 |
| 2013/0335109 A1 * | 12/2013 | Chen | ........................ | H01L 23/544 324/750.25 |

\* cited by examiner

*Primary Examiner* — Benjamin T Liu
(74) *Attorney, Agent, or Firm* — Winston Hsu (57) ABSTRACT

A scribe line structure including a semiconductor substrate, a pad and a first patterned metal layer is provided. The semiconductor substrate has a die region, a die sealing region located outside the die region and a dicing region located outside the die sealing region. The pad is disposed in the dicing region. The first patterned metal layer is disposed in the dicing region, right below and connected to the pad, wherein the first patterned metal layer has a plurality of first patterns directly connected to each other.

17 Claims, 6 Drawing Sheets

SCRIBE LINE STRUCTURE

BACKGROUND OF THE INVENTION

1. Field of the Invention

The present invention relates generally to a scribe line structure, and more specifically to a scribe line structure capable of preventing dicing cracks.

2. Description of the Prior Art

The manufacturing flow of the integrated circuit can be mainly distinguished into three stages as follows: (1) the manufacturing of the substrate, (2) the fabrication of the integrated circuit on the substrate, and (3) the cutting, electric testing, sorting, and packaging of the integrated circuit. When fabricating the integrated circuit on the substrate, the whole substrate is divided uniformly into mail repetitive dies, and the adjacent dies are separated by scribe lines. The cutting step of the integrated circuit utilizes a cutter to cut the substrate into individual dies along the scribe lines.

In recent years, the high integration semiconductor process with an inter-metal dielectric layer collocated by the dual damascene technology and the use of low dielectric materials is the most popular metal interconnect technology to date. Due to the low resistance of copper, and the low dielectric material, the RC delay between the metal wires is greatly reduced. However, for achieving low dielectric property, many of low dielectric materials have loose and weak mechanical strength structures, and are fragile. Therefore a chip crack often occurs from lateral cutting stress while performing wafer dicing. The chip crack damages the die seal ring region of the wafer that protects the die region and induces metal layer delamination. This causes high early failure rate in products, thereby reducing yield in subsequent electric test processes.

SUMMARY OF THE INVENTION

The present invention provides a scribe line structure, which has a patterned metal layer composed of many small pieces of patterns right below a pad, thereby die chipping and cracking will not occur while dicing across the pattern metal layer.

The present invention provides a scribe line structure including a semiconductor substrate, a pad and a first patterned metal layer. The semiconductor substrate has a die region, a die sealing region located outside the die region and a dicing region located outside the die sealing region. The pad is disposed in the dicing region. The first patterned metal layer is disposed in the dicing region, right below and connected to the pad, wherein the first patterned metal layer has a plurality of first patterns directly connected to each other.

According to the above, the present invention provides a scribe line structure, which has a pad disposed in a dicing region, and a first patterned metal layer disposed in the dicing region, right below and connected to the pad, wherein the first patterned metal layer is divided into a plurality of first patterns directly connected to each other. Thus, the first patterned metal layer is constituted by many small pieces of first patterns in a plane instead of being a bulk metal layer, therefore die chipping and lateral cracking can be avoided while dicing because small pieces of the first patterns can be easily removed by de-ionized water imported during dicing.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
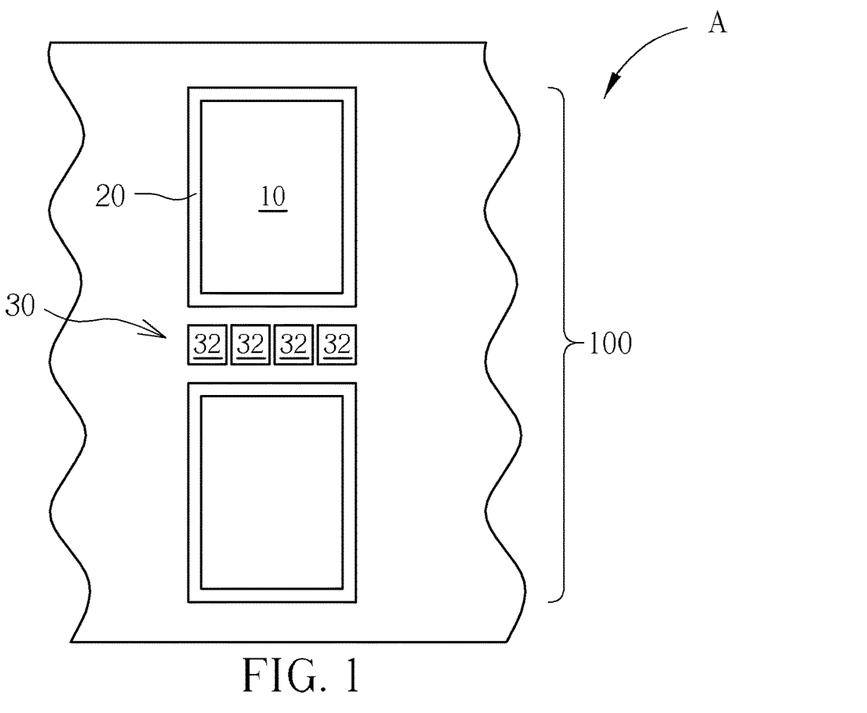
FIG. 1 schematically depicts a top view of a scribe line structure according to an embodiment of the present invention.

FIG. 1 schematically depicts a top view of a scribe line structure according to an embodiment of the present invention. As shown in FIG. 1, a scribe line structure A includes a semiconductor substrate 100. The semiconductor substrate 100 may be a silicon substrate, a silicon containing substrate, a III-V group-on-silicon (such as GaN-on-silicon) substrate, a graphene-on-silicon substrate or a silicon-on-insulator (SOI) substrate or others. The semiconductor substrate 100 may can be divided into a die region 10, a die sealing region 20 and a dicing region 30 (or called a scribe line) according to their purposes. The die sealing region 20 is located outside the die region 10. The dicing region 30 is located outside the die sealing region 20. Thus, the die sealing region 20 is disposed between the die region 10 and the dicing region 30, so that the die sealing region 20 can serve as a blocking wall for preventing the die region 10 from external stress while the semiconductor substrate 100 is diced.

A plurality of pads 32 are disposed in the dicing region 30. The pads 32 may be wafer acceptance test pads placed in the dicing region 30 for testing purpose, but it is not limited thereto. The pads 32 may be composed of aluminum, but it is not limited thereto.

Figure 2:
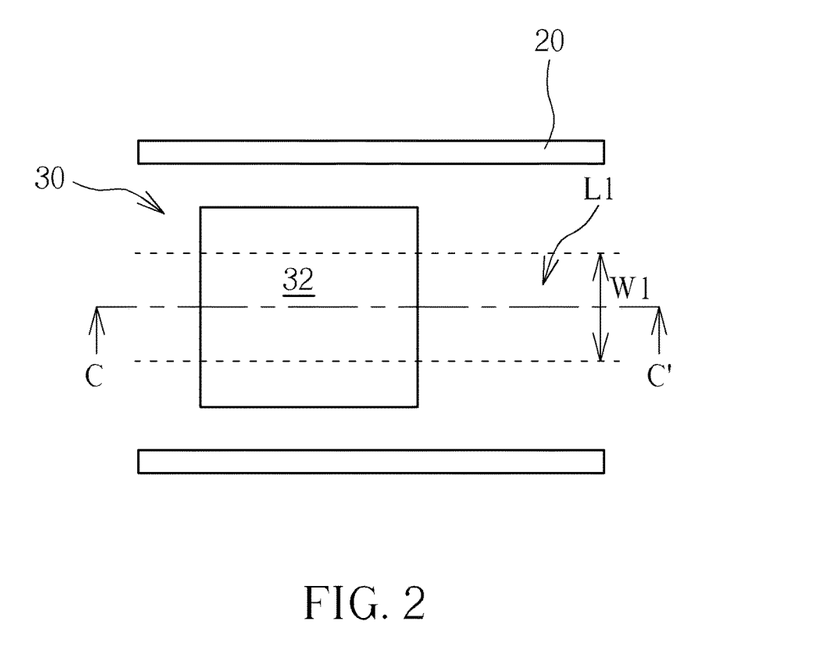
FIG. 2 schematically depicts a top view of a dicing region of FIG. 1.

FIG. 2 schematically depicts a top view of a dicing region of FIG. 1. As shown in FIG. 2, the dicing region 30 has a dicing path L1 for a dicing process carried out thereon, for example the dicing path L1 is the path that a dicing blade cuts through. In this embodiment, the dicing path L1 has a dicing width W1, and the dicing path L1 is preferably along the center line of the dicing region 30, for preventing stresses induced while dicing from cracking the die region 10, or interlayer delamination or peeling caused by a dicing process.

Figure 3:
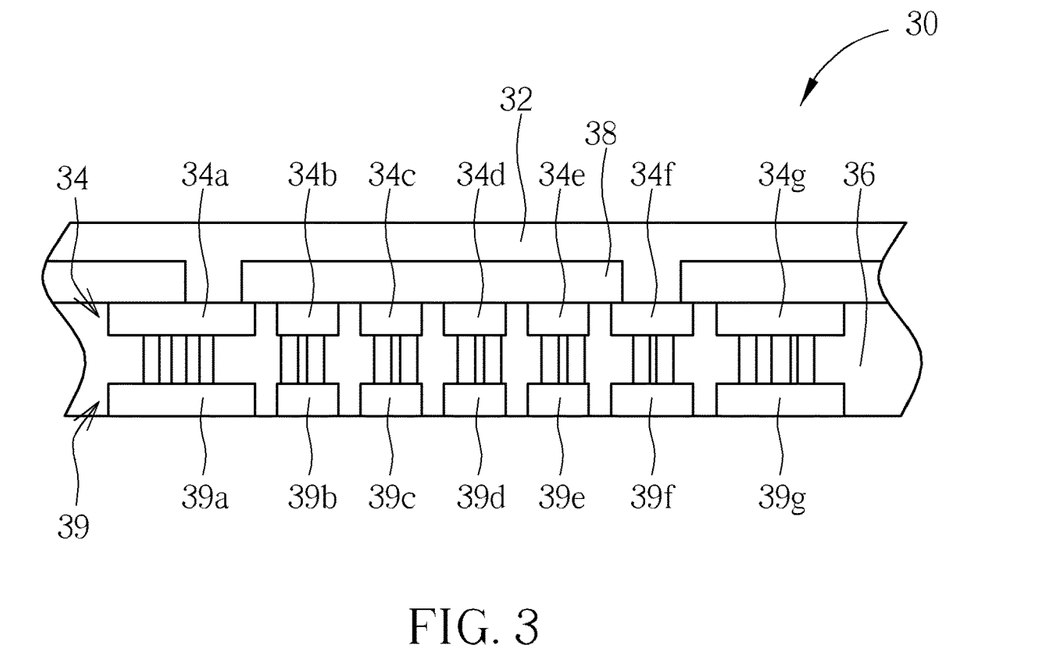
FIG. 3 schematically depicts a cross-sectional view of the dicing region of FIG. 2 along line CC'.

FIG. 3 schematically depicts a cross-sectional view of the dicing region of FIG. 2 along line CC'. As shown in FIG. 3, a first patterned metal layer 34 is also disposed in the dicing region 30. The first patterned metal layer 34 is right below the pad 32 and electrically and physically connected to the pad 32. More precisely, the first patterned metal layer 34 is filled in a first dielectric layer 36 and the pad 32 is physically connected to first patterned metal layer 34 through a second dielectric layer 38. The first patterned metal layer 34 is composed of copper, but it is not limited thereto. In one case, the first patterned metal layer 34 is formed together with metal interconnections (not shown). Preferably, the first patterned metal layer 34 has a different material from the pad 32. The first dielectric layer 36 and the second dielectric layer 38 may be inter metal dielectric layers and may be made of oxide, but it is not limited thereto.

It is emphasized that, the first patterned metal layer 34 is right below the pad 32, thereby the dicing line L1 is also across the first patterned metal layer 34. Since the first patterned metal layer 34, especially for the first patterned metal layer 34 made of copper, will attach on a dicing blade easily while dicing, and cause die chipping and lateral cracking, the layout of the first patterned metal layer 34 becomes extremely important for preventing die chipping and lateral cracking. Thus, in the present invention, the first patterned metal layer 34 is designed to have many small pieces in a plane instead of being a bulk metal layer. That is, the first patterned metal layer 34 includes a plurality of first patterns 34a, 34b, 34c, 34d, 34e, 34f, 34g in a plane, and the first patterns 34a, 34b, 34c, 34d, 34e, 34f, 34g are small enough and can be washed away by de-ionized water imported while dicing. In a preferred embodiment, the width W1 of the dicing line L1 is wider than the width of the first patterns 34a, 34b, 34c, 34d, 34e, 34f, 34g overlapping the dicing line L1. Moreover, these first patterns 34a, 34b, 34c, 34d, 34e, 34f, 34g are directly connected to each other for having the same electrical potential. The number of the first patterns 34a, 34b, 34c, 34d, 34e, 34f, 34g is not restricted thereto, depending upon the needs.

Accordingly, the present invention provides a first patterned metal layer 34 composed of many small pieces in a plane instead of being a bulk metal layer, therefore die chipping and lateral cracking can be avoided.

Some possible layouts of the first patterned metal layer 34 are presented as follows, but the present invention is not restricted thereto. These layouts are applied to the same structure described as FIGS. 1-3; that is, these layouts are all applied to the scribe structure A, meaning the scribe structure A of FIG. 1 just has different first patterned metal layers in the following embodiments. For simplifying the present invention, similar symbols are used in the following embodiments to correspond to the above embodiment of FIGS. 1-3, and common symbols are used in the following embodiments to represent common components in the above embodiment of FIGS. 1-3.

Figure 4:
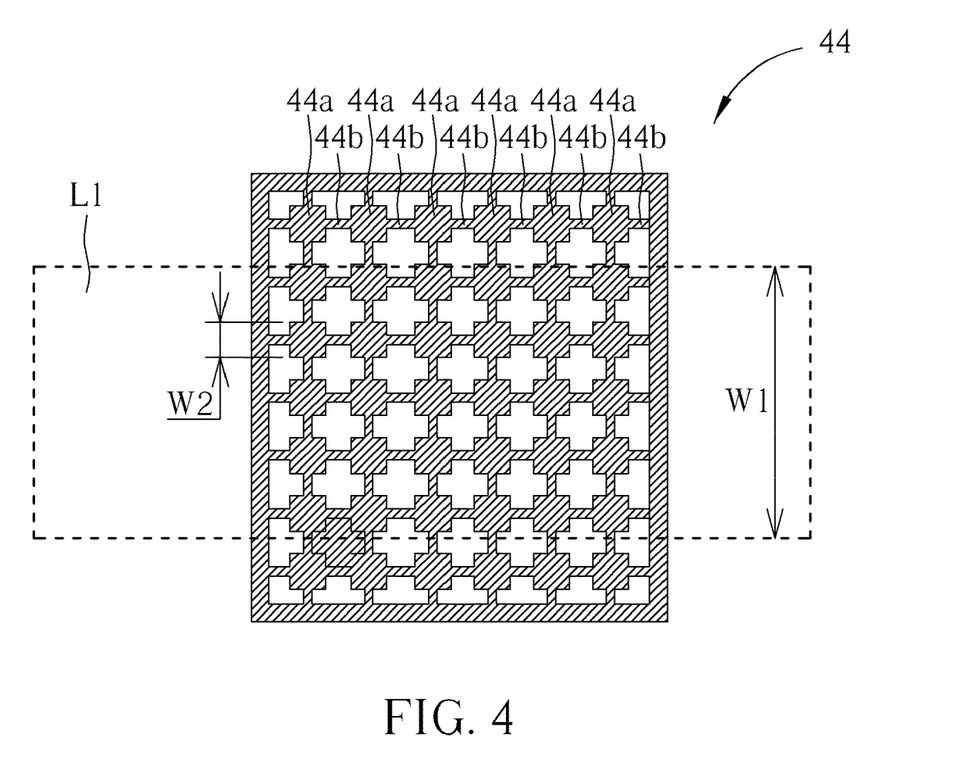
FIG. 4 schematically depicts a top view of another first patterned metal layer of FIG. 3.

FIG. 4 schematically depicts a top view of another first patterned metal layer of FIG. 3. Please refer to FIGS. 1-4, the first patterned metal layer 44 is a mesh metal layer. In this embodiment, the first patterned metal layer 44 is right below the pad 32 and substantially has the same size as the pad 32, but it is not limited thereto. The first patterned metal layer 44 includes first patterns 44a arranged regularly, and the first patterns 44a are arranged as an array. These first patterns 44a are directly connected to each other by first wires 44b to have common electrical potential. The width W1 of the dicing line L1 is wider than the width W2 of the first patterns 44a overlapping the dicing line L1, so that the first patterns 44a can be washed away easily while dicing.

Figure 5:
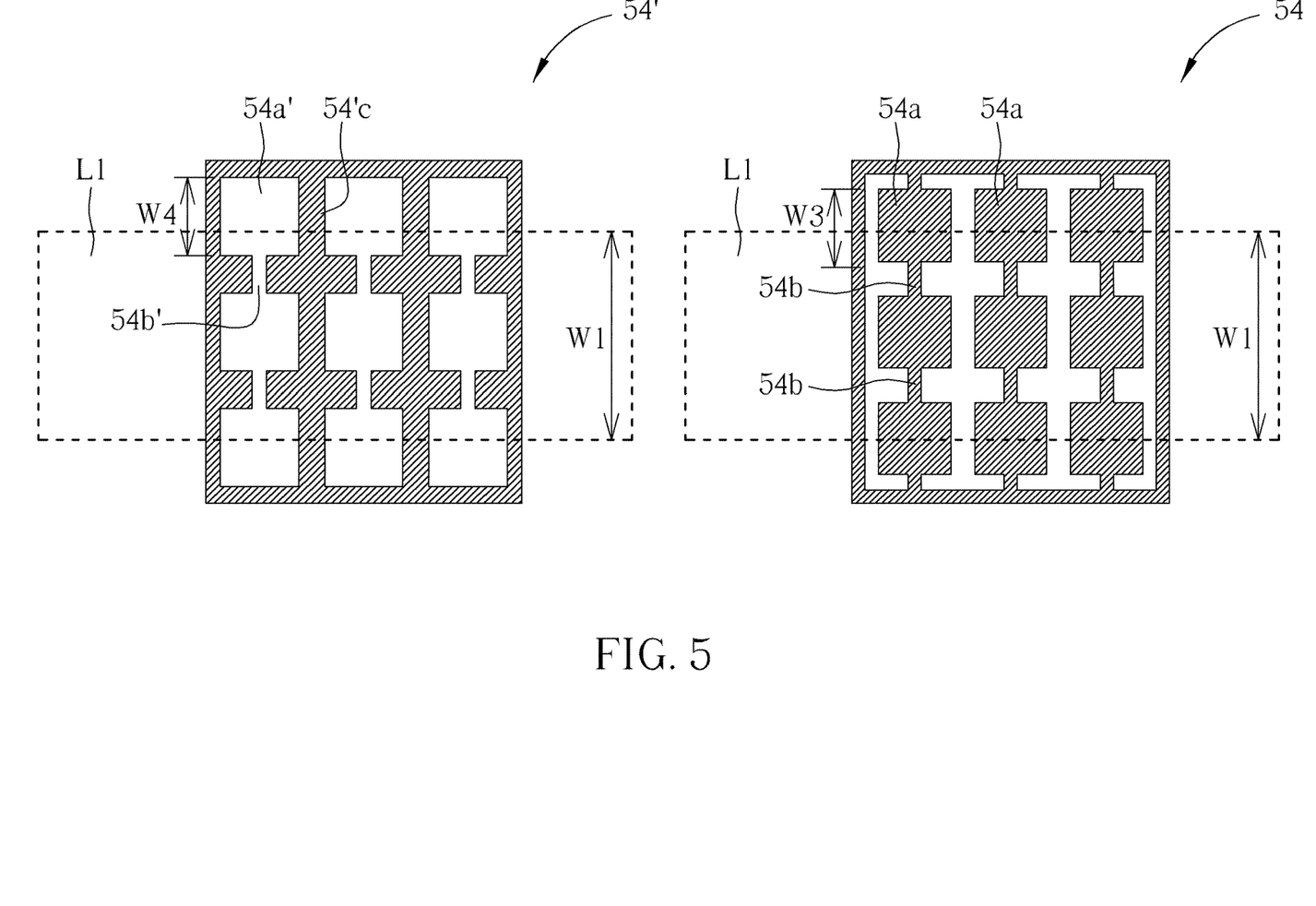
FIG. 5 schematically depicts a top view of another first patterned metal layer of FIG. 3.

FIG. 5 schematically depicts a top view of another first patterned metal layer of FIG. 3. As shown in FIG. 5, the first patterned metal layer 54 of FIG. 5 is similar to the first patterned metal layer 44 of FIG. 4. The difference of the first patterned metal layer 54 from the first patterned metal layer 44 is that: each of the first patterns 44a of the first patterned metal layer 44 connects to four adjacent first patterns 44a through four first wires 44b respectively, but each of the first patterns 54a of the first patterned metal layer 54 connects to two adjacent first patterns 54a through two first wires 54b respectively. In another aspect, the first patterned metal layer 54 and 54' are both mesh metal layers. However, the first patterned metal layer 54 has a positive pattern layout while the first patterned metal layer 54' has a corresponding negative pattern layout. That is, the first patterned metal layer 54 includes first patterns 54 connecting to each other by first wires 54b, but the first patterned metal layer 54' is hollow in corresponding spaces 54a' and 54b'. Furthermore, layouts described in the present invention can be positive layouts and thus corresponding negative layouts can also be embodiments of the present invention.

In this embodiment, the first patterned metal layer 54 includes first patterns 54a arranged regularly, and the first patterns 54a are arranged as an array. Likewise, the first patterned metal layer 54' includes first patterns 54'c arranged regularly, and the first the patterns 54'c are arranged as an array. These first patterns 54a or 54'c are directly connected to each other to have common electrical potential. The width W1 of the dicing line L1 is wider than the width W3 of the first patterns 54a overlapping the dicing line L1. Likewise, the width W1 of the dicing line L1 is wider than the width W4 of the first patterns 54'c overlapping the dicing line L1. Therefore, the first patterns 54a or 54'c can be easily washed away while dicing.

Accordingly, the first patterns 44a/54a/54'c respectively included in the first patterned metal layer 44/54/54' have the same shapes, are arranged regularly and aligned corresponding to each other, but it is not limited thereto. These first patterns 44a/54a/54'c may have different shapes, arranged randomly or shiftedly, crossly or dislocated from each other, depending upon the needs. If the dicing line L1 can be aligned accurately while dicing, the first patterns 44a/54a/54'c are preferably have the same shapes, arranged regularly and aligned corresponding to each other, and the dicing Line L1 is preferably defined to cross as much first wires 44b/54b as possible. It the dicing line L1 cannot be aligned accurately while dicing, the first patterns 44a/54a/54'c are preferably have different shapes, arranged randomly or shiftedly, or dislocated from each other to prevent concentrated parts of the first patterns 44a/54a/54'c from attaching to a dicing blade. Two embodiments of first patterned metal layers including first patterns having different shapes or arranged shiftedly are provided below, but the present invention is not restricted thereon.

Figure 6:
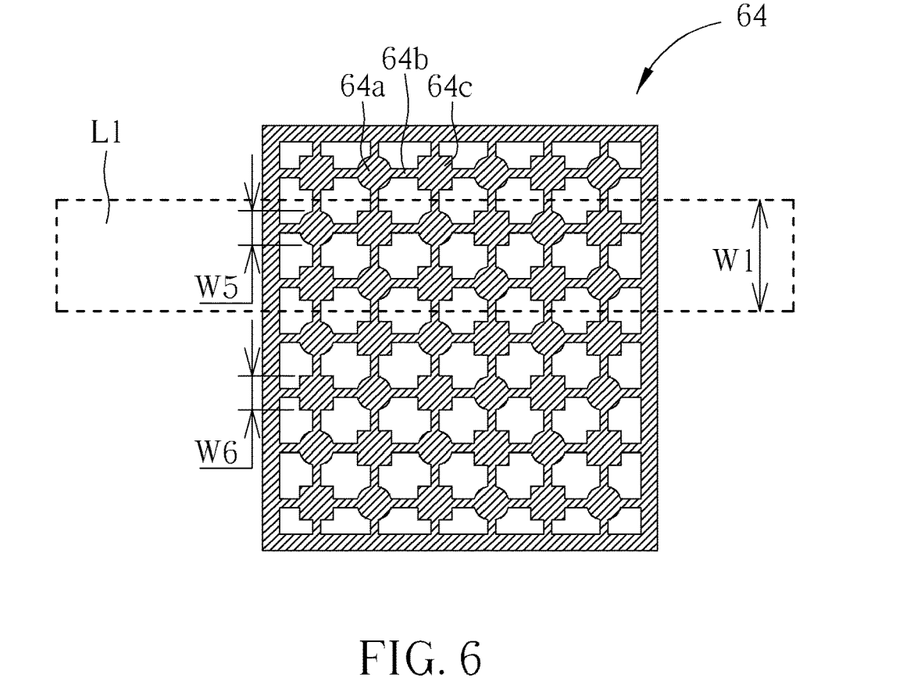
FIG. 6 schematically depicts a top view of another first patterned metal layer of FIG. 3.

FIG. 6 schematically depicts a top view of another first patterned metal layer of FIG. 3. The first patterned metal layer 64 of FIG. 6 is similar to the first patterned metal layer 44 of FIG. 4. The difference of the first patterned metal layer 64 from the first patterned metal layer 44 is that: the first patterned metal layer 64 has first patterns 64a and first patterns 66c arranged crossly and regularly, and electrically and physically connected to each other by first wires 64b, wherein the first patterns 64a and the first patterns 66c have different shapes. In this embodiment, the first patterns 64a all have circular shapes while the first patterns 64c all have rectangular shapes, but it is not limited thereto. In another embodiment, the first patterns 64c may have different shapes more than two. The width W1 of the dicing line L1 is wider than the width W5, W6 of the first patterns 64a, 64c overlapping the dicing line L1, thereby first patterns 64a, 64c can be washed away easily while dicing.

Figure 7:
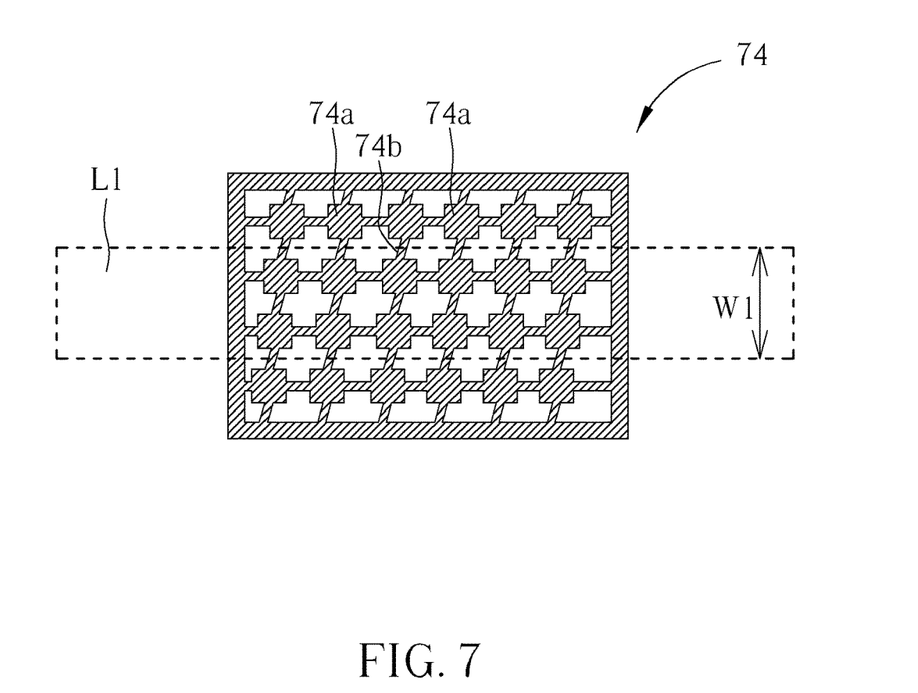
FIG. 7 schematically depicts a top view of another first patterned metal layer of FIG. 3.

FIG. 7 schematically depicts a top view of another first patterned metal layer of FIG. 3. The first patterned metal layer 74 of FIG. 7 is similar to the first patterned metal layer 44 of FIG. 4. The difference of the first patterned metal layer 74 from the first patterned metal layer 44 is that: the first patterned metal layer 74 has first patterns 74a shiftedly arranged and the first patterns 74a are electrically and physically connected to each other by first wires 74b. In this embodiment, the first patterns 74a are all shiftedly arranged in the same direction, but it is not limited thereto. The width W1 of the dicing line L1 is still wider than the width W7 of the first patterns 74a overlapping the dicing line L1, thereby first patterns 74a can be washed away easily while dicing.

Figure 8:
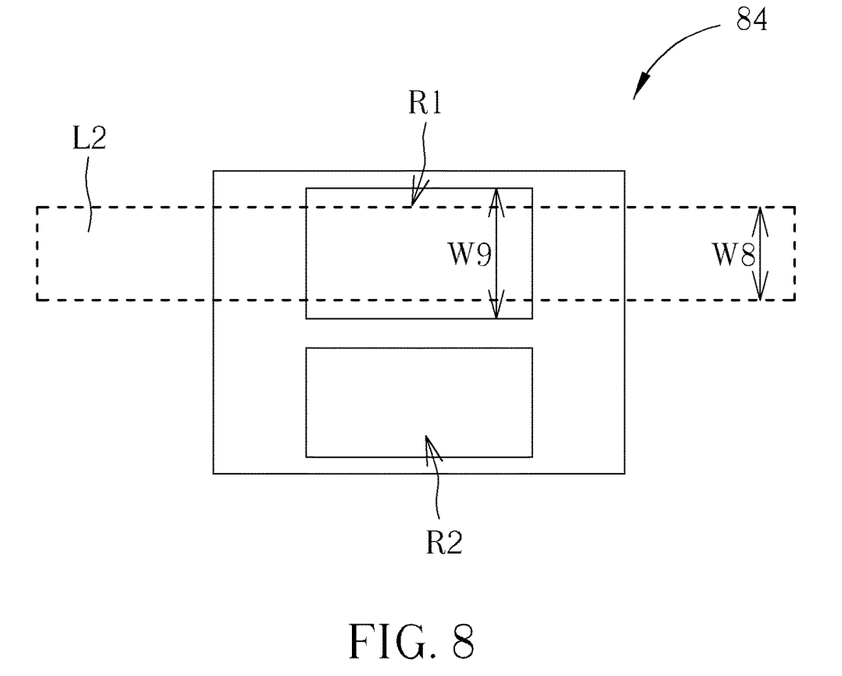
FIG. 8 schematically depicts a top view of another first patterned metal layer of FIG. 3.

Above all, the embodiments of FIGS. 4-7 are all have mesh metal layers provided. Accordingly, at least a part of the first wires 44b/54b/64b/74b are in a dicing line L1 for improving dicing and avoiding die chipping and cracking. However, the present invention is not just applied to mesh metal layers. FIG. 8 schematically depicts a top view of another first patterned metal layer of FIG. 3, wherein a first patterned metal layer of FIG. 8 has a slot in a dicing line of a dicing region.

As shown in FIG. 8, a first patterned metal layer 84 has two slots R1, R2 and one of the slots R1, R2 is in the dicing line L1. Besides, the width W8 of the dicing line L2 is narrower than the width W9 of the slot R1 overlapping the dicing line L1. Preferably, the dicing line L1 crosses the slot R1 in a longitudinal direction. Thus, the dicing line L1 can cross the first patterned metal layer 84 as little as possible, thereby die chipping and cracking can be avoided. In this case, only slot R1 overlaps the dicing line L2, but it is not limited thereto. In another embodiment, the two slots R1 and R2 can both overlap the dicing line L2. The number and the sizes of slots R1, R2 are not limited thereto. However, there must be at least one slot R1, R2 overlapping the dicing line L2.

Furthermore, please refer to FIG. 3 again, a second patterned metal layer 39 including a plurality of second patterns 39a, 39b, 39c, 39d, 39e, 39f, 39g maybe further disposed right below the first patterned metal layer 34. The second patterned metal layer 39 is directly connected to the first patterned metal layer 34 by plugs P. In this embodiment, the second pattern metal layer 39 is aligned to the first pattern metal layer 34 and the second patterns 39a, 39b, 39c, 39d, 39e, 39f, 39g are common to the first patterns 34a, 34b, 34c, 34d, 34e, 34f, 34g, but it is not limited thereto. The second pattern metal layer 39 may be aligned, dislocated or crossly arranged to the first pattern metal layer 34, and may be common or different from the first pattern metal layer 34. Two embodiments are presented as follows, but the present invention is not restricted thereto.

Figure 9:
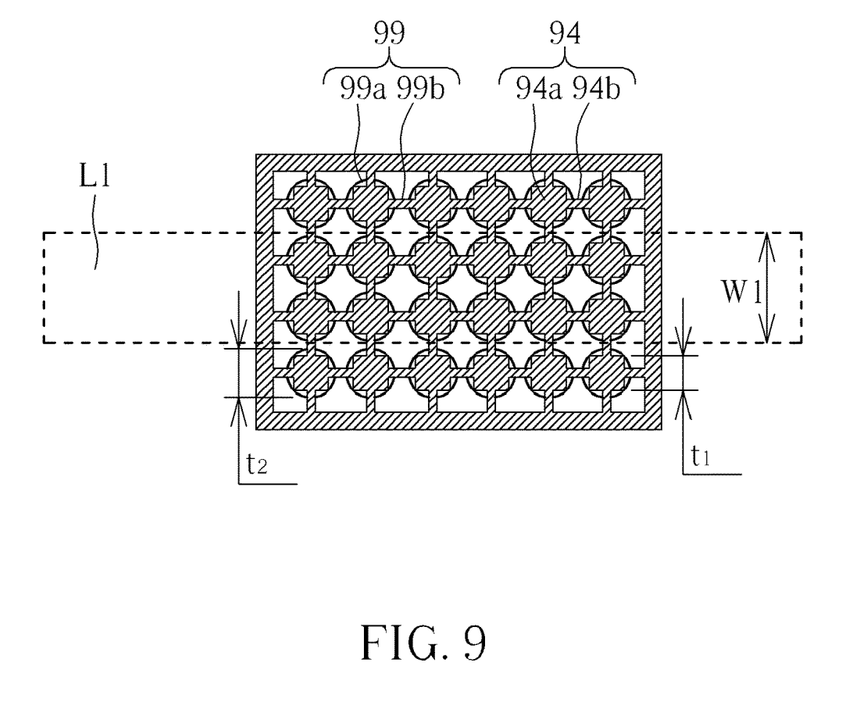
FIG. 9 schematically depicts a top view of another first patterned metal layer and another second patterned metal layer of FIG. 3.

FIG. 9 schematically depicts a top view of another first patterned metal layer and another second patterned metal layer of FIG. 3. As shown in FIG. 9, a first patterned metal layer 94 includes first patterns 94a arranged regularly and electrically and physically connected to each other by first wires 94b; a second patterned metal layer 99 includes second patterns 99a arranged regularly and electrically and physically connected to each other by second wires 99b. In this embodiment, the first patterns 94a have rectangular shapes while the second patterns 99a have circular shapes. The second patterns 99a are aligned and correspond to the first patterns 94a. The width W1 of the dicing line L1 is either wider than the width t1 of the first patterns 94a overlapping the dicing line L1, or wider than the width t2 of the second patterns 99a overlapping the dicing line L1.

Figure 10:
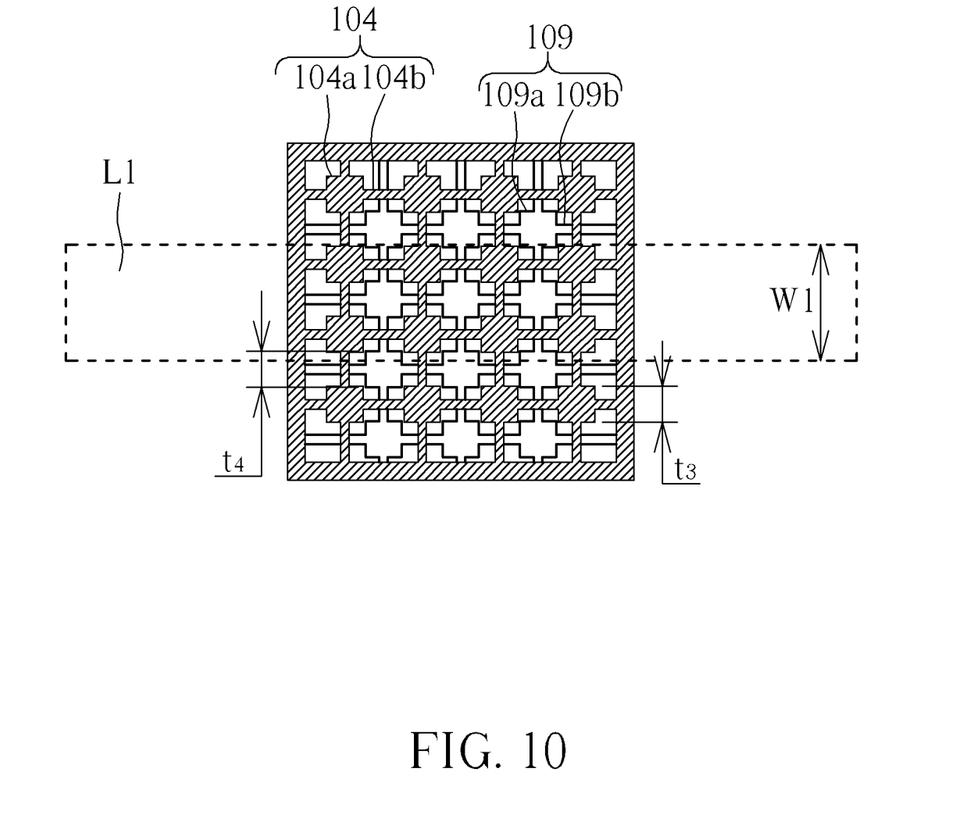
FIG. 10 schematically depicts a top view of another first patterned metal layer and another second patterned metal layer of FIG. 3.

FIG. 10 schematically depicts a top view of another first patterned metal layer and another second patterned metal layer of FIG. 3. As shown in FIG. 10, a first patterned metal layer 104 includes first patterns 104a arranged regularly and electrically and physically connected to each other by first wires 104b; a second patterned metal layer 109 includes second patterns 109a arranged regularly and electrically and physically connected to each other by second wires 109b. In this embodiment, the first patterns 104a and the second patterns 109a all have rectangular shapes. However, the second patterns 109a are crossly arranged corresponding to the first patterns 104a. The width W1 of the dicing line L1 is either wider than the width t3 of the first patterns 104a overlapping the dicing line L1, or wider than the width t4 of the second patterns 109a overlapping the dicing line L1.

Accordingly, at least a part of the second wires 99b/109b are in a dicing line L1 for improving dicing and avoiding die chipping and cracking.

To summarize, the present invention provides a scribe line structure, which has a pad disposed in a dicing region, and a first patterned metal layer disposed in the dicing region, right below and connected to the pad, wherein the first patterned metal layer is divided into a plurality of first patterns directly connected to each other. Thus, the first patterned metal layer is composed of many small pieces of the first patterns in a plane instead of being a bulk metal layer, therefore die chipping and lateral cracking can be avoided while dicing because small pieces of the first patterns can be easily removed by de-ionized water imported during dicing.

Moreover, the first patterns may be directly connected to each other by first wires and at least a part of the first wires are in a dicing line of the dicing region for improving dicing. The first patterns may have the same or different shapes, and may be arranged regularly or shiftedly arranged. For instance, the first patterned metal layer may be a mesh metal layer.

Furthermore, a second patterned metal layer may be disposed right below the first patterned metal layer and directly connected to it. The second patterned metal layer includes second patterns, and the second patterns may be aligned and common to the first patterns, or the second patterns may be crossly arranged corresponding to the first patterns.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A scribe line structure, comprising:
   a semiconductor substrate having a die region, a die sealing region located outside the die region and a dicing region located outside the die sealing region;
   a pad being a single pad disposed in the dicing region, wherein the dicing region comprises a dicing line, and a width of the dicing line is narrower than a width of the pad; and
   a first patterned metal layer disposed in the dicing region, right below and connected to the pad, wherein the first patterned metal layer has a plurality of first patterns directly connected to each other by first wires, at least a part of the first patterns and the first wires are in a dicing line of the dicing region, and the first patterns and the first wires are arranged alternately in a same plane parallel to the pad and right below the single pad, wherein the first patterns, the first wires and the single pad are all disposed in the same dicing region, wherein the first patterns and the first wires contact the pad, wherein the first patterns are shifted arranged with an angular tilt from a vertical plane of a width direction of the dicing line, wherein the width direction is perpendicular to a length direction of the dicing line, and the first pattern is of a solid block shape.

2. The scribe line structure according to claim 1, wherein the pad comprises a wafer acceptance test pad.

3. The scribe line structure according to claim 1, wherein the pad comprises aluminum.

4. The scribe line structure according to claim 1, wherein the first patterned metal layer comprises copper.

5. The scribe line structure according to claim 1, wherein the first patterns have the same shapes.

6. The scribe line structure according to claim 1, wherein the first patterns have at least two different shapes.

7. The scribe line structure according to claim 1, wherein the first patterns are arranged regularly.

8. The scribe line structure according to claim 1, wherein the first patterned metal layer is a mesh metal layer.

9. The scribe line structure according to claim 1, wherein the width of the dicing line is wider than the width of the first patterns overlapping the dicing line.

10. The scribe line structure according to claim 1, wherein the first patterned metal layer comprises at least one slot in a dicing line of the dicing region.

11. The scribe line structure according to claim 10, wherein the dicing line crosses the slot in a longitudinal direction.

12. The scribe line structure according to claim 1, further comprising:
a second patterned metal layer having a plurality of second patterns disposed right below the first patterned metal layer.

13. The scribe line structure according to claim 12, wherein the second patterns are aligned to the first patterns.

14. The scribe line structure according to claim 13, wherein the second patterns are common to the first patterns.

15. The scribe line structure according to claim 12, wherein the second patterns are shiftedly arranged corresponding to the first patterns, so that the first patterns and the second patterns are not vertically aligned.

16. The scribe line structure according to claim 12, wherein the second patterns are connected to each other by second wires, and at least a part of the second wires are in a dicing line of the dicing region.

17. The scribe line structure according to claim 12, wherein the first patterned metal layer is directly connected to the second patterned metal layer.

* * * * *

UNITED STATES PATENT AND TRADEMARK OFFICE
CERTIFICATE OF CORRECTION

PATENT NO. : 10,643,911 B2
APPLICATION NO. : 14/164282
DATED : May 5, 2020
INVENTOR(S) : Kuang-Hui Tang

Page 1 of 1

It is certified that error appears in the above-identified patent and that said Letters Patent is hereby corrected as shown below:

On the Title Page

Item (73), correct the name of the assignee from "UNITED MICROELECTRIC CORP." to --UNITED MICROELECTRONICS CORP.--.

Signed and Sealed this
Seventh Day of July, 2020

Andrei Iancu
*Director of the United States Patent and Trademark Office*